(12) United States Patent
Hamm et al.

(10) Patent No.: US 7,939,438 B2
(45) Date of Patent: May 10, 2011

(54) METHOD OF INHIBITING BACKGROUND PLATING

(75) Inventors: Gary Hamm, Billerica, MA (US); David L. Jacques, Northbridge, MA (US); Carl J. Colangelo, New Bedford, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 125 days.

(21) Appl. No.: 12/383,013

(22) Filed: Mar. 19, 2009

(65) Prior Publication Data

US 2009/0258491 A1   Oct. 15, 2009

Related U.S. Application Data

(60) Provisional application No. 61/070,101, filed on Mar. 19, 2008.

(51) Int. Cl.
*H01L 21/26* (2006.01)
*H01L 21/42* (2006.01)

(52) U.S. Cl. . 438/513; 438/678; 438/753; 257/E21.006; 257/E21.043; 257/E21.977; 257/E21.985; 257/E21.17; 257/E21.134; 257/E21.229; 257/E21.245; 257/E21.267; 257/E21.278; 257/E21.293

(58) Field of Classification Search ............... 438/513, 438/510, 509, 680, 678, 706, 726, 753, 756, 438/757, 932; 257/E21.006, E21.17, E21.043, E21.077, E21.085, E21.134, E21.229, E21.245, E21.259, E21.267, E21.278, E21.293

See application file for complete search history.

(56) References Cited

U.S. PATENT DOCUMENTS

| | | | |
|---|---|---|---|
| 3,600,185 A | | 8/1971 | McGuckin |
| 4,217,183 A | * | 8/1980 | Melcher et al. ............. 205/92 |
| 5,882,435 A | | 3/1999 | Holdermann |
| 2005/0241946 A1 | | 11/2005 | Nagai et al. |
| 2006/0110580 A1 | * | 5/2006 | Aylward et al. ............. 428/172 |
| 2007/0059646 A1 | | 3/2007 | Winscom et al. |
| 2007/0114611 A1 | | 5/2007 | Chidambarrao et al. |

FOREIGN PATENT DOCUMENTS

| | | |
|---|---|---|
| EP | 0 357 124 | 3/1990 |
| EP | 0 432 493 | 6/1991 |
| EP | 1 088 603 | 11/2004 |
| WO | WO 98/22406 | 5/1998 |

OTHER PUBLICATIONS

European Search Report of corresponding European Application No. 09 15 4740.

* cited by examiner

*Primary Examiner* — David Nhu
(74) *Attorney, Agent, or Firm* — John J. Piskorski

(57) ABSTRACT

Methods of inhibiting background plating on semiconductor substrates using oxidizing agents are disclosed.

10 Claims, 3 Drawing Sheets

METHOD OF INHIBITING BACKGROUND PLATING

This application claims benefit of U.S. patent application Ser. No. 61/070,101 filed Mar. 19, 2008.

The present invention is directed to a method of inhibiting background plating in semiconductors. More specifically, the present invention is directed to inhibiting background plating in semiconductors using oxidizing agents.

Plating on regions of a workpiece where plating is not desired is sometimes referred to as background plating. This background plating is often detrimental to the function or aesthetics of a workpiece where selective plating is desired such as, for example, in the fabrication of plated high precision electrical components. Such background plating may lead to electrical shorts in the workpiece and disfunctioning of an electrical apparatus in which the workpiece is used. Further, background plating also results in wastage of the plating material. Such wastage increases the cost of the process and ultimate product. The increased cost may be quite substantial if the particular metal being plated happens to be a precious metal such as gold, silver, platinum or palladium. Even in those situations where metal recovery from regions of background plating is desirable and practical, nevertheless metal recovery adds to the complexity and cost of the overall process for fabricating the final product.

Many conventional methods of selective plating require multiple steps. When a solid mask is used, for example, to cover regions of a workpiece where plating is not desired, the mask is applied to the workpiece, the workpiece is then selectively plated and the mask is stripped. However, there are costs and complexity associated with making, applying and stripping of the mask from the workpiece. Further, the solid mask is not always easily or able to be applied and removed from the workpiece. This is true where there are hard to reach or inaccessible regions of the workpiece that are desired to be masked. An example of such a workpiece is a photovoltaic device where flaws, cracks or pin-holes in dielectric layers coating conductive or semi-conductive materials are sites of background plating. Such defects are small and mask application to the sites is impractical. Further, the defects are often not visible to the naked eye because of their microscopic size, and workers usually do not become aware of the defects until after the metal is plated and the resulting article is unsuitable for commercial use.

Photovoltaic devices, such as solar cells, often include a semiconductor wafer which forms a single large PN junction. Electromagnetic radiation such as sunlight incident upon that junction produces electrical carriers in the device and generates an electrical current, which must be collected and conveyed to an external circuit. The generated current is roughly proportional to the incident radiation. Metallic patterns which are in ohmic contact with the two sides of the PN junction collect the current. Such metallic patterns need to provide a low resistance path to minimize resistive losses of the generated current. The metallic pattern must be limited in its physical extent, especially on the front surface of the device, so as to minimize surface area that is blocks incident radiant energy, i.e. energy lost for current generation purposes. Typically, the front metallic pattern includes narrow strips of very highly conductive material. Between the narrow strips of the conductive material is a thin dielectric material coating doped semiconductor material, such as doped silicon. The dielectric layer may range from 5 µm to 20 µm. This dielectric layer may function as an antireflective layer in solar cells. Examples of such dielectric materials are silicon dioxide and silicon nitride.

During manufacture of photovoltaic devices the dielectric layer is formed on the doped semiconductor material prior to forming the metallic patterns for the device. Formation of the dielectric layer may be done by any conventional method, such as chemical vapor deposition or physical vapor deposition. Once the dielectric layer is deposited a pattern is formed by conventional imaging methods and metal is deposited in the pattern using conventional methods to make it conductive. During metallization of the pattern undesired background plating may occur due to defects in the dielectric layer resulting in an article unsuitable for commercial use. As mentioned above such defects are typically not noticeable until after metallization.

The defects, such as cracks, flaws or pin-holes, expose the doped emitter layer of the semiconductor and act as sites for background plating, thus compromising desired selective plating. Such defects are believed to be caused during one or more steps of the manufacturing process and handling of the semiconductor due to the fragility and thinness of the dielectric layer. Since the defects are small, many of which are microscopic in size, applying conventional solid masks to address the background plating problem is impractical. Accordingly, there is a need for a maskless method of addressing the background plating in semiconductors.

U.S. Pat. No. 4,217,183 discloses a maskless method of minimizing the background plating on an electrically conductive surface, such as a cathode, in the metallization of wafer chips used in integrated circuits and circuit boards. The cathode may be a metal, photoconductor or composite structure of an insulator and a conductor. This patent discloses placing a cathode and anode in a nickel or copper electrolyte, focusing a beam of energy, such as with an argon laser, through the electrolyte to selective regions of the cathode where plating is desired and establishing an electrical potential between the cathode and anode. Although the patent discloses a maskless method for minimizing background plating, such a method still may not be suitable for addressing the background plating caused by the defects in dielectric layers of semiconductors. Generally, the defects are not observable to the naked eye. Accordingly, selective application of the beam of energy while trying to avoid the defects would be impractical. Further, even if a pattern for directing the beam of energy was formed on the workpiece which excluded the dielectric material, sufficient energy from the beam may overlap with microscopic defects in the dielectric layer on the periphery with the pattern resulting in detrimental background plating.

Accordingly, there remains a need in the industry for methods of inhibiting background plating at dielectric defects in semiconductors.

A method includes providing a semiconductor including a conductive pattern for conductive busbars and current collecting lines and a dielectric layer coating spaces between the conductive pattern on a front side of the semiconductor, the dielectric layer includes one or more defects; contacting at least the dielectric layer with the one or more defects with one or more oxidizing agents; and selectively depositing a metal layer on the conductive pattern.

Background plating on dielectric layers results in commercially unacceptable products. Unfortunately, such defects in the dielectric layer typically are not observable to the naked eye because of their microscopic size, thus many conventional methods, such as masking, are not practical in addressing the problem. Additionally, many conventional non-masking methods may not be suitable as well also because of the microscopic size of the defects. Workers typically do not become aware of the defects until after metallization where background plating on the dielectric layer is readily observable. Unfortunately, there is no commercially practical method of removing the undesired plating from the dielectric layer and the resulting product is unsuitable for commercial use.

Application of one or more oxidizing agents to at least the dielectric layer prior to metallization of a conductive pattern inhibits the undesired background plating resulting in a commercially viable product. The oxidizing agent may be applied in gaseous or liquid form and need not be applied only to the defect sites but on the entire dielectric layer. Accordingly, workers need not be aware of the location of the defects or that the semiconductor has such defects, but may use the method to treat all semiconductors in the manufacturing process, thus providing a rapid and efficient process for providing commercially acceptable semiconductors.

Figure 1:
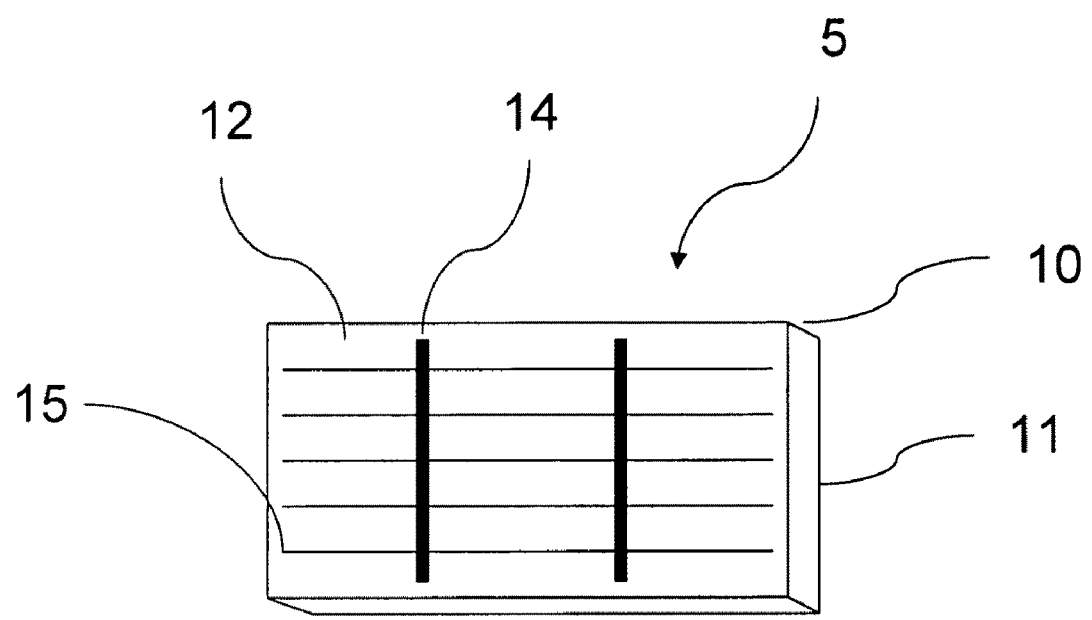
FIG. 1 illustrates a photovoltaic device of the invention.

As used throughout this specification, the term "plating" refers to the deposition of a metal layer, such as by electroplating or electroless plating, as the context indicates. "Deposition" and "plating" are used interchangeably throughout this specification. The indefinite articles "a" and "an" are intended to include both the singular and the plural. The term "selectively depositing" means that metal deposition occurs in specific desired areas on a substrate with inhibition of background plating. The following abbreviations have the following meanings unless the context clearly indicates otherwise: ° C.=degrees Celsius; g=grams; mL=milliliter; L=liter; A=amperes; dm=decimeter; µm=micrometers; nm=nanometers; min.=minute; sec.=second; UV=ultra violet; slpm=standard liters per minute; lpm=liters per minute; torr=1 mm Hg=133.322368 pascals; ppm=parts per million; and ISSG=is situ steam generation. All percentages and ratios are by weight unless otherwise indicated. All ranges are inclusive and combinable in any order except where it is clear that such numerical ranges are constrained to add up to 100%.

The methods of inhibiting background plating on dielectric layers of semiconductors by application of one or more oxidizing agents to at least the dielectric layer may be used with a wide variety of photovoltaic devices, such as, for example, solar cells. Such photovoltaic devices are typically produced using a semiconductor substrate, such as a semiconductor wafer. In one embodiment, solar cells are composed of monocrystalline or polycrystalline or amorphous silicon wafers. In another embodiment, solar cells are composed of polycrystalline silicon wafers. While the description below is with regard to silicon wafers, other suitable semiconductor wafers, such as gallium-arsenide, silicon-germanium, and germanium, may also be used. When silicon wafers are used, they typically have a p-type base doping.

The wafers may be circular, square or rectangular in shape or may be any other suitable shape. Such wafers may have a wide variety of dimensions. For example, circular wafers may have a diameter of 150 nm, 200 nm, 300 nm, 400 nm, or greater.

The rear side of a wafer is metallized. The entire rear side may be metal coated or a portion of the rear side may be metal coated, such as to form a grid. Such rear side metallization may be provided by a variety of techniques, and may be done prior to the metallization of the front side of the wafer or may be done simultaneously with the metallization of the front side of the wafer. In one embodiment, a metal coating is applied to the rear side in the form of an electrically conductive paste, such as a silver-containing paste, an aluminum-containing paste or a silver and aluminum-containing paste. Such conductive pastes typically include conductive particles embedded in a glass matrix and an organic binder. Conductive pastes may be applied to the wafer by a variety of techniques, such as screen printing. After the paste is applied, it is fired to remove the organic binder. When a conductive paste containing aluminum is used, the aluminum partially diffuses into the rear side of the wafer, or if used in a paste also containing silver, may alloy with the silver. Use of such aluminum-containing paste may improve the resistive contact and provide a "p+"-doped region. Heavily doped "p+"-type regions by previous application of aluminum or boron with subsequent interdiffusion may also be produced. In one embodiment, an aluminum-containing paste may be applied to the rear side and fired before the application of the rear side metal coating. The residue from the fired aluminum-containing paste may optionally be removed prior to the application of the rear side metal coating. In an alternate embodiment, a seed layer may be deposited on the rear side of the wafer and a metal coating may be deposited on the seed layer by electroless or electrolytic plating. Such metal deposition on the seed layer on the rear side of the wafer may be performed simultaneously with the metal deposition on the front side of the wafer using the present invention.

The front side of the wafer may optionally be subjected to crystal-oriented texture etching in order to impart to the surface an improved light incidence geometry which reduces reflections. To produce the semiconductor junction, phosphorus diffusion or ion implantation takes place on the front side of the wafer to produce an n-doped region and providing the wafer with a PN junction. The n-doped region may be referred to as the emitter layer.

A dielectric layer is added to the front side or emitter layer of the wafer. Such dielectric layer may serve as both a passivation layer and an antireflection layer. Suitable dielectric layers include, without limitation, silicon oxide layers such as $SiO_x$, silicon nitride layers such as $Si_3N_4$, a combination of silicon oxide and silicon nitride layers, and a combination of a silicon oxide layer and/or a silicon nitride layer with a titanium oxide layer such as $TiO_x$. In the foregoing formulae, x is the number of oxygen atoms. Such dielectric layer may be deposited by a number of techniques, such as by various vapor deposition methods, for example, chemical vapor deposition and physical vapor deposition.

The front side of a wafer typically contains a metallized pattern. For example, the front side of a wafer may be composed of current collecting lines and current busbars. Current collecting lines are typically transverse to the busbars and typically have a relatively fine-structure (i.e. dimensions) relative to current busbars.

In one embodiment, the front side of the wafer may be metallized using a conductive paste, which may be the same as or different from any conductive paste used on the rear side of the wafer. Any conductive paste used to metallize the front side of a wafer typically does not contain aluminum. The firing of any conductive paste used on the rear side and front side of a wafer may be performed in one operation or in separate operations. The temperature used in the firing of the paste depends on the particular paste used, the thickness of any dielectric (or antireflective) layer used, among other factors. The choice of such temperature is well within the ability of those skilled in the art. The firing process may be performed in an oxygen-containing atmosphere, an inert atmosphere, a reducing atmosphere, or a combination of any of these. For example, the firing may be performed at a first temperature in an atmosphere containing little oxygen and then at a second temperature under an inert atmosphere or under a reducing atmosphere, where the second temperature is higher than the first temperature.

Following the firing process, the wafer may optionally be contacted with a buffered acid solution, such as a buffered hydrofluoric acid solution, to remove any oxide produced during the firing procedure. Such contact may be by spraying the solution on the wafer or by dipping the wafer into such solution or by any other suitable means.

In another embodiment, the front side or emitter layer of the wafer is coated with an antireflective layer, such as silicon nitride. A trench pattern is then defined on the front side. The trench pattern reaches through the antireflective (or dielectric) layer and into the semiconductor body of the wafer. The trenches may reach a depth of 1 to 25 μm into the semiconductor body of the wafer. Deeper or shallower trench depths may be employed. A variety of processes may be used to form the trench pattern, such as, but not limited to, laser ablation, mechanical means, and lithographic processes, all of which are well known in the art. Such mechanical means include sawing and scratching. Typical photolithographic processes include disposing an imagable material on the surface of the wafer, patterning the imagable material to form trenches, transferring the trench pattern to the wafer, depositing a metal layer in the trench pattern and removing the imagable material. In one embodiment, the imagable material is removed before the step of depositing a metal layer in the trench pattern. In another embodiment, the imagable material is removed after the step of depositing a metal layer in the trench pattern. When the imagable material is present during the metal deposition step, such imagable material typically avoids any dyes, such as contrast dyes, that absorb in the wavelength of radiation used during the metal deposition step. Imagable material present during the plating step typically contains a dye that is transparent to the wavelength of radiation used during the plating step.

When the imagable material is a liquid, such material may be disposed on the surface of the wafer by any suitable technique such as, but not limited to, by spin coating, doctor blading, curtain coating, and roller coating. When the imagable material is a dry film, such material may be disposed on the surface of the wafer by lamination.

The imagable material is patterned by exposing the imagable material to actinic radiation through a mask. The choice of actinic radiation will depend upon the particular imagable material selected. Suitable wavelengths of actinic radiation include, but are not limited to, 500 nm, to below 200 nm such as 430 nm, 405 nm, 365 nm, 248 nm, and 193 nm, as well as extreme ultraviolet ("EUV"), and e-beam. Lasers may also be used to pattern the imagable material.

The pattern in the imagable material is next transferred to the wafer substrate. Pattern transfer may be performed using wet chemical etching techniques or by using dry etching techniques. Suitable dry etching techniques include, without limitation, plasma etching such as reactive ion etching. The trench pattern typically is composed of lines of relatively narrow cross-sectional dimension which are current collecting lines and lines of relatively thick cross-sectional dimension which are busbars. The busbars are transverse to the current collecting lines.

The imagable material may be removed using any suitable polymer remover, such as those sold by Rohm and Haas Electronic Materials (Marlborough, Mass.). Such removers may be alkaline, acidic or essentially neutral.

Irrespective of the technique used to form the trench pattern, such trenches may optionally be contacted with acid (such as hydrofluoric acid) or alkali to texture or roughen the trench surfaces. Optionally, another diffusion process may be performed using an n-type dopant, resulting in "n++"-doping in the trench regions.

A conductive paste is typically deposited into the trenches in the front side of the wafer. The rear side of the wafer may be metallized before the front side, after the front side, or concurrently with the front side. When the rear side is metallized using a conductive paste, the front and rear sides are typically fired in a single step.

After application of the conductive paste and prior to metallization of the front side or emitter layer of the wafer, at least the front side of the wafer with the dielectric layer is treated with an oxidizing agent to inhibit any background plating at sites of defects in the dielectric layer which may occur during metallization of the conductive pattern. Typically the defects, such as flaws, cracks or pin-holes, are not observable with the naked eye. Such defects may be macroscopic but typically they are microscopic and are not noticed until metal plating is done on the front of the wafer. The defects are believed to expose the doped emitter layer of the wafer to the plating bath used to plate metal, thus background plating occurs. The defects are believed to be caused by marginal coverage of the wafer during the formation of the dielectric, or damage during handling and processing of the wafer due to the thinness and fragility of the dielectric layer.

Oxidizing agents include, but are not limited to, oxygen reactants, such as atomic oxygen, ozone (triatomic oxygen) and ionized oxygen radicals such as are obtained in plasma with or without diatomic oxygen. Other suitable oxidizing agents include, but are not limited to, hydrogen peroxide and hydroxyl radicals. Further, suitable oxidizing agents include, but are not limited to, nitric acid, sulfuric acid and persulfates. Mixtures of the foregoing oxidizing agents also may be used. Typically oxygen reactants are used to treat the front of the wafer. More typically, ozone is used to treat the wafers. Oxidizing agents are applied to the semiconductor for a period of 30 sec. to 400 min. or such as from 60 sec. to 300 min. or such as from 90 sec. to 200 min.

The oxidizing agents may be applied by any suitable method known in the art. When ozone is used as the oxidizing agent, the wafer may be placed in a closed tank with a source of ozone connected to the tank. The ozone is pumped into tank in amounts sufficient for the inhibition of background plating. Alternatively, ozone may be sprayed over the wafer using an ozone sparger wand in sufficient amounts to inhibit background plating. Ozone concentrations range from 275 ppm to 450 ppm, or such as from 300 ppm to 350 ppm. Conventional ozone generators may be used as sources of ozone. A suitable ozone generator that may be used is a CD-10/AD unit supplied by RGF $O_3$ Systems of West Palm Beach, Fla., U.S.A. which produces ozone by a corona discharge route. In general, ozone is applied to the wafer for 40 sec. to 200 min., or such as from 30 min. to 150 min., or such as from 70 min. to 100 min. Ozone generators have a typical ozone output of 0.5 g/hour to 2 g/hour. Air flow may range from 5 lpm to 12 lpm.

Optionally, UV light may be applied to the wafer during application of ozone. UV exposure units also may be obtained from RGE $O_3$ Systems, but other similar apparatus may be equally suitable. Typically the UV wavelengths are from 200 nm to 450 nm. While not being bound by theory, application of UV light to ozone may generate an excited oxygen atom by way of the following reaction I:

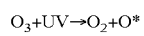

Oxygen radicals also may be formed under ISSG conditions. The in situ steam generation process is a low pressure process where hydrogen and oxygen are proportionately mixed and are introduced into the process chamber directly without pre-combustion. The wafer is heated and the reaction between hydrogen and oxygen occurs near the wafer surface. The hot wafer acts as the ignition source. Generally, under ISSG conditions the oxygen radical is created primarily by way of the following reaction II:

$$H_2+O_2 \rightarrow 2OH$$

$$H_2+OH \rightarrow H_2O+H$$

$$O_2+H \rightarrow OH+O^*$$

$$H_2+O \rightarrow OH+H$$

The oxygen radical concentration is not dependent upon reactor volume, but depends upon pressure, temperature and relative amount of hydrogen in the chamber. The oxygen radical peak concentration results from a balance of radical generation through molecular collisions that are strong functions of temperature and pressure, and recombination processes that are strong functions of pressure or flow rate in the chamber. Accordingly, the ISSG process depends upon using process pressure, flow rate and temperature in the chamber within specified ranges. Such parameters may be effective: temperature of 800° C. to 1000° C.; pressure of 1 torr to 20 torr; flow rate of $H_2+O_2$ from 1 slm to 40 slm. The ratio of $H_2/H_2+O_2$ is from 0.1% to 40%.

Hydroxyl radicals may be generated by photolysis using combinations of ozone and UV light or hydrogen peroxide and UV light or the combination of ozone, hydrogen peroxide and UV light. Commercially available equipment may be used to generate hydroxyl radicals from hydrogen peroxide and ozone. Ozone may be generated at UV wavelengths from 200 nm to 450 nm. Typically, ozone is generated at 254 nm. While not being bound by theory, UV radiation applied to ozone generates an excited oxygen atom according to reaction I above. The excited oxygen atom may then generate hydroxyl radicals in one of two ways. The excited oxygen atom may react with moisture (water vapor) according to reaction III:

$$O^*+H_2O \rightarrow 2OH^*$$

or they may react with moisture to form hydrogen peroxide which then reacts with UV radiation to form hydroxyl radicals by the following reaction IV:

$$O^*+H_2O \rightarrow H_2O_2$$

$$H_2O_2+UV \rightarrow 2OH^*$$

Ozone amounts may range from 0.1 g/hour to 50 g/hour, or such as from 1 g/hour to 20 g/hour. Optionally, UV light may be eliminated in reaction IV allowing the hydrogen peroxide to act as the oxidizing agent. Additionally, hydrogen peroxide may be applied in its liquid form without generating it from ozone. Hydrogen peroxide may be used in amounts of 0.1 g/L to 10 g/L or such as from 1 g/L to 5 g/L.

When nitric or sulfuric acid are used, they are at concentrations of 30% to 75% by weight of the entire solution. Persulfates are used in concentrations of 1 g/L to 10 g/L.

After the front side pattern and rear side of the wafer are metallized using conductive paste and treated with one or more of the oxidizing agents, a layer of metal is then selectively deposited on the front side conductive pattern. During metallization background plating is inhibited. Such layer of metal may be any suitably conductive metal such as gold, silver or copper. Typically, silver is deposited on the conductive pattern. In one embodiment, the deposited metal layer is composed of the same metal used in the conductive paste. For example, a silver layer is deposited on a silver-containing conductive paste:

The pattern containing a deposited metal layer, and particularly an electrodeposited metal layer, over a fired conductive paste has increased efficiency as compared to a pattern composed only of fired conductive paste. In addition, the use of a deposited metal layer over the fired conductive paste allows for a reduction in the width of both the current collecting lines and busbars, which provides more of the solar cell surface that can be exposed to incident light and therefore more current generation. Smaller metal lines means less metal on the surface to block the incident light.

FIG. 1 illustrates a representative photovoltaic device 5, such as a solar cell. Device 5 has a semiconductive wafer 10 having a PN junction and a rear side 11 and a front side 12. Rear side 11 is metallized, such as with silver. Front side 12 contains a metallic pattern (such as a silver pattern) composed of busbars 14 and current collecting lines 15. The metallic pattern is composed of a layer of deposited silver over a silver-containing conductive paste. The metallic pattern is in ohmic contact with front side 12. Typically, front side 12 is covered with a dielectric which functions as an antireflective coating, not shown, such as silicon nitride or other dielectric material. The dielectric layer coats the spaces on the front side of the wafer between the busbars and current collecting lines of the metallic pattern.

After treating the wafer by one of the oxidation methods described above, the wafer is now ready to be plated with a layer of metal over the pattern on the front side and over the metallized rear side. A metal layer, such as a silver, gold or copper layer is deposited on the fired conductive paste using a conventional metal plating bath, typically an electroplating bath. Typically the metal layer is a silver layer using a silver plating bath, typically a cyanide-free silver plating bath. Metal plating is done while subjecting the semiconductor wafer to incident light. Examples of useful silver plating baths are aqueous solutions and include silver ions, at least one water-soluble nitro-containing compound, at least one surfactant, at least one amido-compound, and at least one component chosen from a water-soluble amino acid, a water-soluble sulfonic acid, and mixtures thereof. An example of a commercially useful silver plating bath is available as ENLIGHT™ silver plate 600 from Rohm and Haas Electronic Materials, Marlborough, Mass.

The metal ions in the plating baths may be provided by using any suitable solution-soluble metal compound, typically a metal salt. Such metal compounds may include, without limitation: metal halides; metal nitrate; metal carboxylates such as acetate, metal formate and metal gluconate; metal-amino acid complexes such as metal-cysteine complexes; metal alkyl sulfonates such as metal methane sulfonate and metal ethane sulfonate; metal alkylol sulfonates, metal tolyl sulfonates, and metal phenol sulfonates; and metal cyanides. Exemplary metal compounds include copper compounds, gold compounds and silver compounds. In one embodiment, the metal compound is a silver compound. In particular, suitable metal compounds include silver nitrate, silver-cysteine complex, silver methane sulfonate, silver ethane sulfonate, silver propane sulfonate, silver phenol sulfonate, and silver acetate. When the metal is silver, the metal salt is typically not a silver halide due to the limited solubility of such salts. Mixtures of metal compounds may be used in the present plating baths. Such mixtures may be metal compounds having the same metal but being different compounds, such as a mixture of silver nitrate and silver-cysteine complex or metal compounds having different metals such as a mixture of silver-cysteine complex and copper gluconate. When different metal compounds having different metals are used in admixture, the present metal plating baths deposit an alloy of the different metals.

The metal compounds are added to the plating bath in an amount sufficient to provide a metal ion concentration in the plating bath of 0.1 to 60 g/L, more typically from 0.5 to 50 g/L, and still more typically from 1 to 50 g/L. When the metal ions are silver ions, the concentration of silver ions in the bath is typically in an amount of 2 to 40 g/L. Such metal compounds are generally commercially available form a variety of sources, such as Aldrich chemical company, Milwaukee, Wis.

Typically the metal plating baths are electroplating baths and contain an electrolyte. Any of a wide variety of electrolytes may be used in the present metal plating baths, including acids and bases. Exemplary electrolytes include, without limitation, alkane sulfonic acids such as methane sulfonic acid, ethane sulfonic acid and propane sulfonic acid; alkylol sulfonic acids; aryl sulfonic acids such as toluene sulfonic acid, phenyl sulfonic acid and phenol sulfonic acid; amino-containing sulfonic acids such as amido sulfonic acid; sulfamic acid; mineral acids; carboxylic acids such as formic acid and haloacetic acids; hydrogen halide acids; and pyrophosphate. Salts of acids and bases also may be used as the electrolyte. Further, the electrolyte may contain a mixture of acids, a mixture of bases or a mixture of one or more acids with one or more bases. Such electrolytes are generally commercially available from a variety of sources, such as Aldrich chemical company.

While not intending to be bound by theory, it is believed that the nitro-containing compounds in the plating bath function to stabilize and complex the bath. Any of a wide variety of water-soluble nitro-containing compounds may be used. Such nitro-containing compounds include, without limitation, nitro-containing carboxylic acids and their salts and nitro-containing sulfonic acids and their salts. Such nitro-containing compounds may contain one or more nitro-groups. The water-soluble nitro-containing compound typically has at least one heterocyclic group. In a further embodiment, the nitro-containing compound is an aromatic heterocyclic compound. Exemplary nitro-containing compounds include, without limitation, 2-nitrophthalic acid, 3-nitrophthalic acid, 4-nitrophthalic acid and/or m-nitrobenzene sulfonic acids. Typically, the nitro-containing compound is used in an amount of 0.1 to 200 g/L of the bath, and more typically 0.5 to 175 g/L and still more typically 1 to 150 g/L. Such nitro-containing compounds are generally commercially available form a variety of sources, such as Aldrich chemical company.

A wide variety of surfactants may be used in the plating baths. Any of anionic, cationic, amphoteric and nonionic surfactants may be used. Exemplary nonionic surfactants include esters of succinic acid. In one embodiment, the surfactant is chosen from cationic and amphoteric surfactants. Exemplary cationic surfactants include, but are not limited to, 1,3-didecyl-2-methylimidazolium chloride available from Degussa under the trademark TEGOTAIN™. In another embodiment, the surfactant is amphoteric, such as an alkylbetaine available from Degussa under the trademark TEGOTAIN™. Mixtures of surfactants may be used. Such surfactants are typically present in the plating bath in an amount of 0.1 to 5 g/L.

Optionally, vitamins may be included in the present plating baths. They may be fat-soluble or water-soluble. Typically, a water-soluble vitamin is used. Suitable fat-soluble vitamins include A, $D_1$, $D_2$, $D_3$, $K_1$, $K_2$, and E. Suitable water-soluble vitamins include C, $B_1$, $B_2$, $B_3$, $B_6$ and $B_{12}$. Exemplary vitamins include, without limitation, retinol, sterols, ergocalciferol, cholecalciferol, phytonadione, multiprenyl-menaquinone, α-tocopherol, β-tocopherol, ascorbic acid, thiamin, nicotinic acid, riboflavin, pantothenic acid, biotin, pyridoxine, folic acid and cyanocobalamin. Typically, the vitamins used are ascorbic acid, thiamin, nicotinic acid, riboflavin, pantothenic acid, biotin, pyridoxine, and folic acid. As used herein, the term "vitamin" is intended to include the salts of vitamins.

In general, when vitamins are added to the baths, vitamins are present in the plating baths in amounts of 0.01 to 150 g/L, typically from 0.5 to 100 g/L and more typically from 1 to 100 g/L. Vitamins are generally commercially available from a variety of sources, such as Aldrich chemical company.

A wide variety of amido-compounds may be used in the plating baths. Suitable amido-containing compounds include, without limitation, sulfonic acid amides such as succinic acid sulfamide and carboxylic acid amides such as succinic acid amide (succinamic acid).

In general, amido-compound is present in the plating baths in an amount of 0.01 to 150 g/L, typically from 0.5 to 100 g/L and more typically from 1 to 100 g/L. Amido-compounds are generally commercially available from a variety of sources, such as Aldrich chemical company. Additionally amido-compounds may be generated in situ from imides, such as, for example, succinimide. While not being bound by theory, imides added to the alkaline bath at bath temperatures convert to their corresponding amido-compounds. This is believed to occur through nucleophilic attack by hydroxyl ions ($OH^-$) at a carbon-nitrogen bond (C—N) of the imide.

Any amino acid may suitably be used in the plating baths, including derivatives of amino acids and salts of amino acids. The amino acids of may contain one or more mercapto groups in addition to one or more amino groups. Examples of suitable amino acids include, but are not limited to, glycine, alanine, cysteine, methionine and 4-amino-nicotinic acid. When an amino acid is used in the plating baths it is used in an amount of 0.1 to 150 g/L, more typically from 0.5 to 150, and more typically from 0.5 to 125 g/L. Mixtures of amino acids may be used. Such metal compounds are generally commercially available form a variety of sources, such as Aldrich chemical company. When the metal is silver, the water-soluble amino acid compound is typically present in excess of the stoichiometric amount of silver.

A wide variety of water soluble sulfonic acids may be used in the plating baths. Exemplary sulfonic acids include any of the sulfonic acids described above for the electrolyte. When a sulfonic acid is used as the electrolyte, no additional sulfonic acid is required. Typically, the sulfonic acid is present in an amount of 0.1 to 200 g/L.

Optionally, the plating baths may contain one or more additional components. Such additional components include, without limitation, brighteners, grain refiners, ductility enhancers, anti-tarnish agents and anti-freeze agents. Sulfone-containing compounds may be used as brighteners. In particular, suitable sulfone-containing compounds contain one or two aromatic rings on the sulfone group. Such aromatic rings may optionally be substituted by one or more substituents chosen from nitro, amino, halo, alkyl, and metals. When present, the sulfone-containing compound is typically used in an amount of 0.001 to 5 g/L of the plating bath.

A wide variety of anti-tarnish agents may optionally be used in the present plating baths. Suitable anti-tarnish agents include, without limitation, triazoles, benzotriazoles, tetrazoles, imidazoles, benzimidazoles, and indazoles. Typically the anti-tarnish agents are ($C_1$-$C_{16}$)alkylimidazoles and arylimidazoles. Exemplary anti-tarnish agents include, but are not limited to, methylimidazole, ethylimidazole, propylimidazole, hexylimidazole, decylimidazole, undecylimidazole, 1-phenylimidazole, 4-phenylimidazole, hydroxybenzotriazole, aminobenzotriazole, 2-imidazolecarboxaldehyde, benzotriazolecarboxylic acid, 2-guanidinobenzimidazole, 2-aminoindazole, chlorobenzotriazole, hydroxyethylbenzotriazole, hydroxyethylimidazole, hydroxybenzimidazole and 1,2,4-triazole. Mixtures of anti-tarnish may be used in the plating baths. In general, when an anti-tarnish agent is used, it is present in an amount from 0.005 to 50 g/L.

In a further embodiment, the metal plating bath may optionally contain a buffering agent. Exemplary buffering agents include, but are not limited to, borate buffer (such as borax), phosphate buffer, citrate buffer and carbonate buffer. The amount of the buffer used is that amount sufficient to maintain the pH of the plating bath at a desired level, such amount being well known to those skilled in the art.

In a still further embodiment, an alloying metal may optionally be added to the plating bath. Any suitable alloying metal may be used. Such alloying metals are well known to those skilled in the art.

The present plating baths typically have a pH in the range of 7 to 14, more typically from 7 to 12, and still more typically from 9-12. The working temperature of the present plating baths is typically in the range of 10 to 30° C. When the plating bath is a silver plating bath, the working temperature is typically in the range of 10 to 20° C., and more typically from 15 to 20° C. A chiller is typically used to maintain the plating bath at a temperature below room temperature.

The metal plating baths used in the present invention have sufficient stability under the conditions of illumination used in light assisted electroplating to provide metal deposits on photovoltaic devices that meet desired specifications. Additionally high current outputs are also possible on the metal plated photovoltaic devices, such that the amount of energy used during the metal electroplating step can be reduced, thereby reducing the operating costs. The plating baths are sufficiently stable under the conditions of light induced plating to permit their use.

Figure 2:
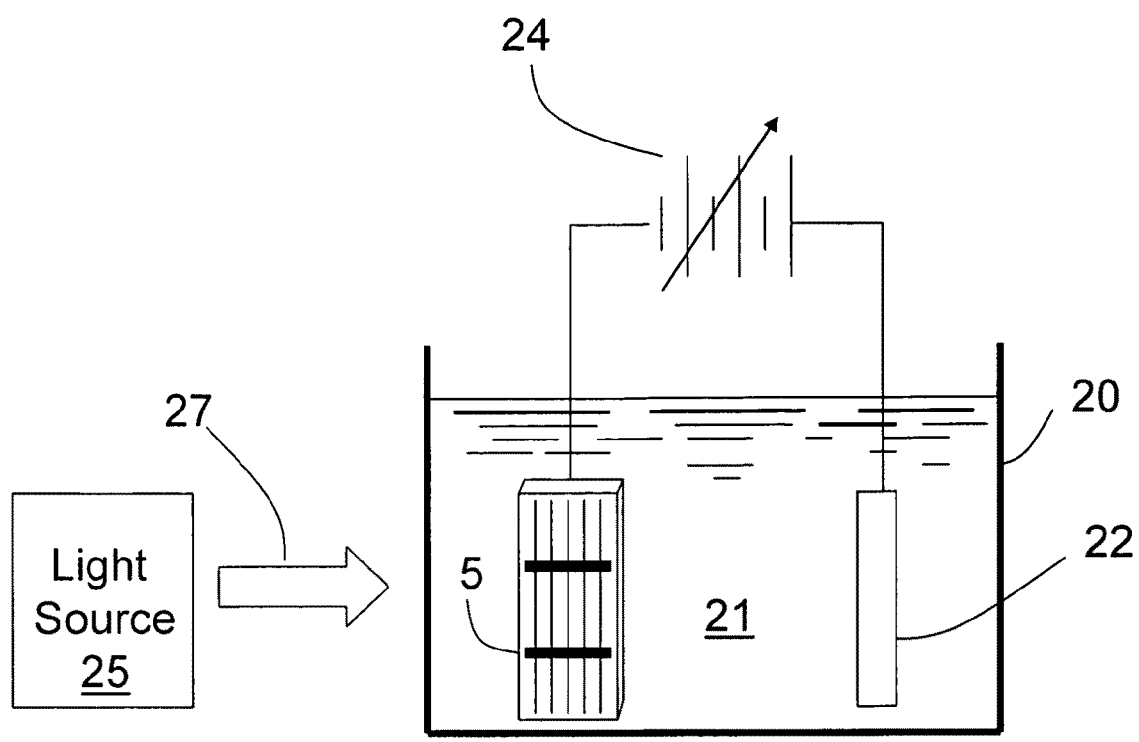
FIG. 2 is a schematic representation of providing a metal coating on a photovoltaic device according to the invention.

The patterned wafer 5 is now ready for thick layer of metal to be deposited on it. FIG. 2 schematically depicts a setup for light induced electroplating of a metal layer according to the invention. The patterned wafer 5, prepared as described above, is submerged in plating bath 21 contained in plating cell 20. Patterned wafer 5 is the cathode in the plating cell. The plating bath 21 is as described above. A light source 25 is positioned to illuminate wafer 5 with radiant energy generally indicated by the numeral 27. The positive terminal of power source 24 contacts silver anode 22 and the negative terminal contacts the back, or P side of wafer 5. If patterned wafer 5 is a silicon solar cell, light source 25 can be, for example, a quartz-halogen lamp which provides energy similar to that of the solar spectrum to which the silicon solar cell is photovoltaically sensitive. A variety of other light sources may be used, such as, but not limited to, incandescent lamps such as a 250 Watt lamp, and mercury lamps. The light energy 27 can be either continuous or pulsed. Pulsed illumination can be achieved, for example, by interrupting the light with a mechanical chopper.

Plating cell 20 must be of such a material as to be chemically inert with respect to the bath 21 and must also be transparent to light energy 27. Alternatively, the wafer can be positioned horizontally in plating cell 20 and illuminated from above the bath, in which case plating cell 20 need not be transparent. For plating silver on a single silicon wafer 5 as shown, a quartz beaker is a suitable plating cell 20. A silver anode 22 such as a silver sheet dissolves in the bath and keeps the bath saturated with silver as the plating proceeds.

By illuminating the front of wafer 5 with light energy 27 and by applying a potential to the plating cell from power supply 24, plating simultaneously occurs on the front and back of wafer 5. The applied potential may be continuous or pulsed. The impinging light energy generates a current in the solar cell. The rate of plating on the front side of wafer 5 is a function of the intensity of the radiation incident on the wafer since the generated current is proportional to the incident intensity. The rate of plating on the front and back surfaces are independently controllable by adjusting the light intensity and the external current density, respectively. A silver layer of 1 to 25 µm thickness is generally desired for a concentrator solar cell, with the exact thickness depending on various factors such as on the application, cell size, pattern and geometry. Since the solar cell was treated with an oxidizing agent by one of the methods described above, background plating is inhibited on the front of wafer 5.

The applied potential used may have a range of current density. Typical current densities are from 0.1 $A/dm^2$ to 10 $A/dm^2$, and more typically from 0.1 $A/dm^2$ to 5 $A/dm^2$. The particular current requirement is dependent upon the particular size of the wafer used. If the front of the wafer is illuminated and the external potential is reduced to about 50 milliamperes or less, the plating continues normally on the front surface but no plating occurs on the rear of the wafer. Front illumination improves the uniformity of the rear plating and overcomes all of the difficulties associated with ohmic drops through the seed layer to points distant from the electrical contact. The plating process may optionally include one or more reverse plating steps, such as a pulse periodic reverse plating process.

The plating process has been described with particular reference to the plating of a layer of silver. The process works equally well for plating other materials such as copper, gold or mixtures of tin and nickel. The mixtures of tin and nickel can be plated from an aqueous bath comprising stannous chloride, nickel chloride, ammonium hydroxide, and ammonium fluoride. The tin nickel mixtures have found use as an environmentally inert cap over other metal layers. Also, the plating processes disclosed above have been described with respect to silicon wafers used in solar cells; however, photovoltaic devices fabricated from materials other than silicon can also be used, with appropriate changes where necessary, for example, in the source of light energy employed.

Application of one or more oxidizing agents to at least the dielectric layer prior to metallization of a conductive pattern as described above inhibits the undesired background plating resulting in a commercially acceptable product. As described above the oxidizing agent may be applied in gaseous or liquid form and need not be applied only to the defect sites but on the entire dielectric layer. Accordingly, workers need not be aware of the location of the defects or that the semiconductor has such defects, but may use the method to treat all semiconductors in the manufacturing process, thus providing a rapid and efficient process for providing commercially acceptable semiconductors. Further, the methods of applying an oxidizing agent to a dielectric layer with defects resolves the problem of background plating which many conventional methods are not able to adequately address.

The following examples are included to illustrate various aspects of the invention but are not intended to limit the scope of the invention.

EXAMPLE 1

A silver electroplating bath was prepared by combining the following components and adding sufficient deionized ("DI") water to make 1 liter of solution.

| | |
|---|---|
| 8 g/L silver as silver gluconate | 2 g/L m-nitrobenzene sulfonic acid |
| 10 g/L methane sulfonic acid solution (70%, neutralized with potassium hydroxide solution) | 25 g/L succinic acid amide |
| 4 g/L methionine | 1 mL/L TEGOTAIN 485 (1% aqueous solution) |
| 20 g/L borax | 0.1 mL/L sulfone derivative (1% aqueous solution) |
| 20 g/L succinic acid sulfamide | |

The pH of the plating bath was maintained in the range of 9 to 12. The temperature of the plating bath was maintained at 25 to 35° C.

EXAMPLE 2

A silver electroplating bath was prepared by combining the following components and adding sufficient DI water to make 1 liter of solution.

| | |
|---|---|
| 9 g/L silver as silver methanesulfonate | 4 g/L 4-nitrophthalic acid |
| 15 g/L methane sulfonic acid solution (70%, neutralized with potassium hydroxide solution) | 15 g/L nicotinic acid amide |
| 10 g/L glycine | 5 mL/L TEGOTAIN 485 (1% aqueous solution) |
| 25 g/L borax | |

The pH of the plating bath was maintained in the range of 9.5 to 10.5. The temperature of the plating bath was maintained at 25 to 35° C.

EXAMPLE 3

A silver electroplating bath was prepared by combining the following components and adding sufficient DI water to make 1 liter of solution.

| | |
|---|---|
| 10 g/L silver as silver methanesulfonate | 2 g/L 2-nitrophthalic acid |
| 5 g/L methane sulfonic acid solution (70%, neutralized with potassium hydroxide solution) | 25 g/L nicotinic acid amide |
| 5 g/L cysteine | 3 mL/L TEGOTAIN 485 (1% aqueous solution) |
| 20 g/L borax | 0.1 mL/L sulfone derivative (1% aqueous solution) |

The pH of the plating bath was maintained in the range of 9.5 to 10.5. The temperature of the plating bath was maintained at 25 to 35° C.

EXAMPLE 4

A wafer as shown in FIG. 1 having a pattern of current collecting lines and busbars formed from fired silver paste and having a dielectric layer of silicon nitride in spaces between the current collecting lines and busbars was contacted with a 25% by volume aqueous methane sulfonic acid solution and then rinsed with DI water.

Figure 3:
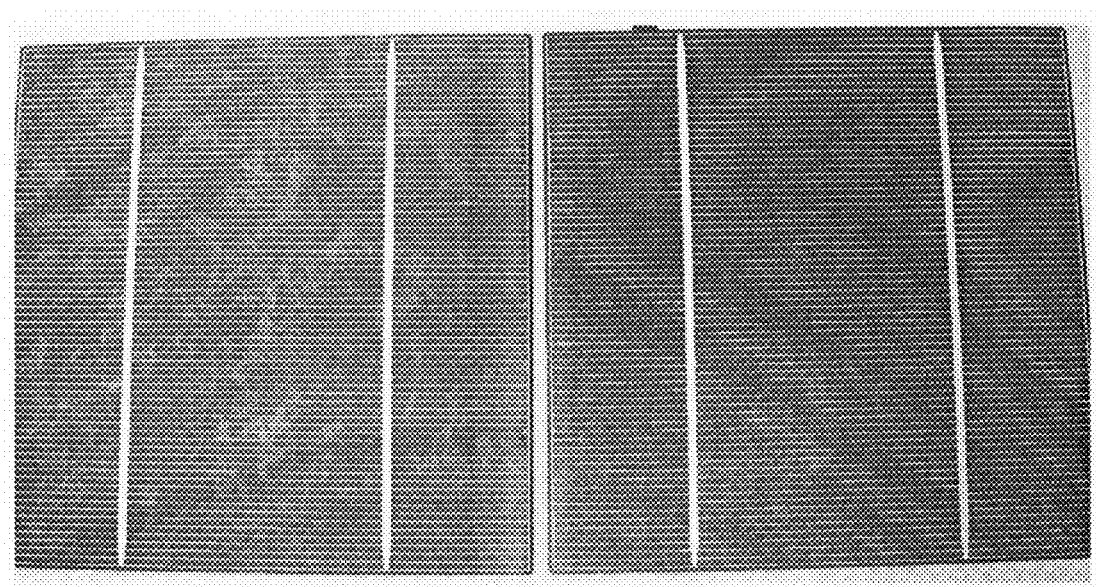
FIG. 3 is a photograph comparing a solar cell panel treated with ozone for 90 minutes prior to metallization and a solar cell panel which was not treated prior to metallization.

A plating cell containing the silver plating bath of Example 1 and equipped with a 250 Watt lamp and a silver anode was provided. The patterned wafer was immersed in the plating bath. A current density of 1-5 A/dm$^2$ was applied with irradiation. Plating was continued for 30 minutes, after which time the light was extinguished and the wafer was removed from the plating bath, rinsed with DI water for 1 minute and then dried. An electrodeposited layer of silver having a thickness of 2-3 μm was obtained over the fired silver paste. In addition, sections of the silicon nitride dielectric showed evidence of background plating. The background plating was visible as irregular pale blotches on the silicon nitride as shown in the wafer on the left in FIG. 3.

EXAMPLE 5

The plating process in Example 4 is repeated except the silver plating bath in Example 2 is used to plate the fired silver paste. Background plating on the silicon nitride dielectric layer is expected as shown by the wafer on the left in FIG. 3.

EXAMPLE 6

The plating process in Example 4 is repeated except the silver plating bath in Example 3 is used to plate the fired silver paste. Background plating on the silicon nitride dielectric layer is expected as shown by the wafer on the left in FIG. 3.

EXAMPLE 7

Two wafers having the structure as shown in FIG. 1 and having a pattern of current collecting lines and busbars formed from fired silver paste and having a dielectric layer of silicon nitride in spaces between the current collecting lines and busbars were contacted with a 25% by volume aqueous methane sulfonic acid solution and then rinsed with DI water. The wafers were then placed in a 7 liter tank. Ozone was fed into the tank from a small ozone generator. Ozone at a concentration of 320 ppm was applied to the wafers for 90 minutes.

After 90 minutes the patterned wafers were placed in plating cells containing the silver plating bath of Example 1. The plating cells were equipped with a 250 Watt lamp and a silver anode. The patterned wafers were immersed in the plating bath. A current density of 1-5 A/dm$^2$ was applied with irradiation. Plating was continued for 30 minutes, after which time the light was extinguished and the wafers were removed from the plating bath, rinsed with DI water for 1 minute and then dried. An electrodeposited layer of silver having a thickness of 2-3 μm was obtained over the fired silver paste. In addition the wafers showed no background plating as opposed to the wafer in Example 4 which was not treated with ozone. One of the two wafers treated with ozone is shown on the right in FIG. 3. No background plating was observed. The second wafer which was treated with ozone had substantially the same appearance. Accordingly, application of ozone to a wafer with a silicon nitride dielectric layer reduced background plating.

EXAMPLE 8

The method of treating a wafer with ozone followed by metallization of the fired paste with silver as described in Example 7 is repeated except the silver bath of Example 2 is used. Significant inhibition of background plating on the silicon nitride dielectric is expected as in Example 7.

EXAMPLE 9

The method of treating a wafer with ozone followed by metallization of the fired paste with silver as described in Example 7 is repeated except the silver bath of Example 3 is used. Significant inhibition of background plating on the silicon nitride dielectric is expected as in Example 7.

What is claimed is:

1. A method of inhibiting background plating on a semiconductor substrate using oxidizing agents, the method comprising:
    a) providing a semiconductor comprising a conductive pattern for conductive busbars and current collecting lines and a dielectric layer coating spaces between the conductive pattern on a front side of the semiconductor, the dielectric layer comprises one or more defects;
    b) contacting at least the dielectric layer with one or more oxidizing agents; and
    c) selectively depositing a metal layer on the conductive pattern.

2. The method of claim 1, wherein the oxidizing agents are chosen from oxygen reactants.

3. The method of claim 1, wherein the oxidizing agents are chosen from hydrogen peroxide and hydroxyl radicals.

4. The method of claim 1, wherein the oxidizing agents are chosen from nitric acid, sulfuric acid,, ammonium hydroxide and persulfates.

5. The method of claim 1, wherein the dielectric layer is contacted with the oxidizing agent for 30 sec. to 400 min.

6. The method of claim 1, further comprising applying light to the semiconductor during selectively depositing the metal layer on the conductive pattern.

7. The method of claim 6, wherein the light is continuous or pulsed.

8. The method of claim 1, wherein the metal layer is silver, gold, copper or a metal alloy.

9. The method of claim 1, wherein the metal layer is silver and is selectively deposited from a cyanide-free electrolyte.

10. The method of claim 9, wherein the electrolyte has a pH of 7 to 14.

* * * * *